(12) United States Patent
Achter et al.

(10) Patent No.: US 9,042,150 B2
(45) Date of Patent: May 26, 2015

(54) PROGRAMMABLE AND FLEXIBLE REFERENCE CELL SELECTION METHOD FOR MEMORY DEVICES

(71) Applicant: Spansion LLC, Sunnyvale, CA (US)

(72) Inventors: Michael Achter, Mountain View, CA (US); Evrim Binboga, Pleasanton, CA (US); Harry Kuo, Palo Alto, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 91 days.

(21) Appl. No.: 13/737,321

(22) Filed: Jan. 9, 2013

(65) Prior Publication Data

US 2014/0192581 A1 Jul. 10, 2014

(51) Int. Cl.
| | |
|---|---|
| G11C 5/06 | (2006.01) |
| G11C 16/06 | (2006.01) |
| G11C 7/02 | (2006.01) |
| G11C 7/06 | (2006.01) |
| G11C 16/28 | (2006.01) |
| G11C 7/14 | (2006.01) |

(52) U.S. Cl.
CPC .. *G11C 5/06* (2013.01); *G11C 7/06* (2013.01); *G11C 16/28* (2013.01); *G11C 7/14* (2013.01)

(58) Field of Classification Search
CPC .............. G11C 16/28; G11C 11/5642; G11C 2211/5634; G11C 11/22; G11C 2013/0054; G11C 11/4099; G11C 7/065; G11C 11/1673
USPC ................ 365/63, 185.21, 210.1, 185.07
See application file for complete search history.

(56) References Cited

U.S. PATENT DOCUMENTS

| | | | |
|---|---|---|---|
| 6,765,845 B2 | 7/2004 | Choi et al. | |
| 7,196,945 B2 * | 3/2007 | Kato ...................... | 365/189.07 |
| 2003/0099133 A1 | 5/2003 | Won et al. | |
| 2003/0210583 A1 | 11/2003 | Yiu et al. | |
| 2004/0017718 A1 * | 1/2004 | Ooishi ...................... | 365/210 |
| 2009/0168578 A1 | 7/2009 | Scade et al. | |
| 2010/0202231 A1 * | 8/2010 | Boeve ...................... | 365/210.1 |
| 2010/0244892 A1 | 9/2010 | Paul | |
| 2012/0026799 A1 * | 2/2012 | Lee ...................... | 365/185.21 |

FOREIGN PATENT DOCUMENTS

KR 10-2004-0043453 A 5/2004

OTHER PUBLICATIONS

International Search Report and Written Opinion of the International Searching Authority for International Application No. PCT/US2014/010489, mailed Jun. 19, 2014.

* cited by examiner

*Primary Examiner* — J. H. Hur
*Assistant Examiner* — Ajay Ojha

(57) ABSTRACT

An exemplary system includes an array of interconnected cells and a flexible decoder. The array is configured to receive a selection signal as input, select a cell based upon the selection signal, and provide an output based on the selected cell. The flexible decoder is configured to receive an input, generate a selection signal based on the input and one or more characteristics of the array of interconnected cells, and provide the selection signal to the array of interconnected cells.

22 Claims, 16 Drawing Sheets

PROGRAMMABLE AND FLEXIBLE REFERENCE CELL SELECTION METHOD FOR MEMORY DEVICES

BACKGROUND

1. Field

The present disclosure relates to non-volatile memory and reference cell selection.

2. Background Art

Advances in semiconductor manufacturing processes, digital system architecture, and wireless infrastructure, among other things, have resulted in a vast array of electronic products, particularly consumer products, that drive demand for ever-increasing performance and density in non-volatile memory.

One means of increasing the performance and density of non-volatile memories such as flash memory, is to shrink the dimensions of the floating gate transistors that are used in flash memories. It is well-recognized that shrinking the physical dimensions of the floating gate transistor also reduces the size of the floating gate itself and thus reduces the amount of charge that can be stored. One drawback of this approach, however, is such systems are more prone to manufacturing defects.

Memory read operations are performed on a memory array cell by comparing its potential level or active conducting current against a known reference voltage or a reference current under a technology determined electric field. Reference voltage or current is typically sourced from a smaller reference array structure which can be built from memory cells or fixed voltage or current sources depending on the technology and design preferences. Each read type operation can be defined with different electric fields across the memory cell and can have its own reference source for fine tuning purposes.

Both memory cells and reference cells can suffer from similar manufacturing defects. Conventionally, the way in which a reference cell is selected for a given operation is fixed by the manufacturer. Thus, the conventional fixed reference selection scheme results in manufacturing related yield loss as well as non-ideal reference behavior during active read type operations.

BRIEF SUMMARY

Systems, methods, and computer program products for flexible/programmable reference cell selection are described herein.

In an embodiment, a system includes an array of interconnected cells and a flexible decoder. The array of interconnected cells is configured to receive a selection signal as input, select a cell based upon the selection signal, and provide an output based upon the selected cell. The flexible decoder is configured to receive an input, generate a selection signal based on the input and one or more characteristics of the array of interconnected cells, and provide the selection signal to the array of interconnected cells.

In another embodiment, a method of conditioning a flexible reference array is disclosed. An input is received and a selection signal is generated, based on the input and one or more characteristics of a reference array of interconnected reference sources. The selection signal is provided to the reference array, wherein the reference array provides a reference current or voltage as output corresponding to the selection signal. The receiving, generating, and providing steps are repeated for a plurality of inputs to determine a relationship between the inputs and their respective output currents or voltages. The generation of selection signals is changed so as to change the relationship between the plurality of inputs and their respective output currents or voltages.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles of the invention and to enable a person skilled in the relevant art(s) to make and use embodiments of the invention.

Figure 1:
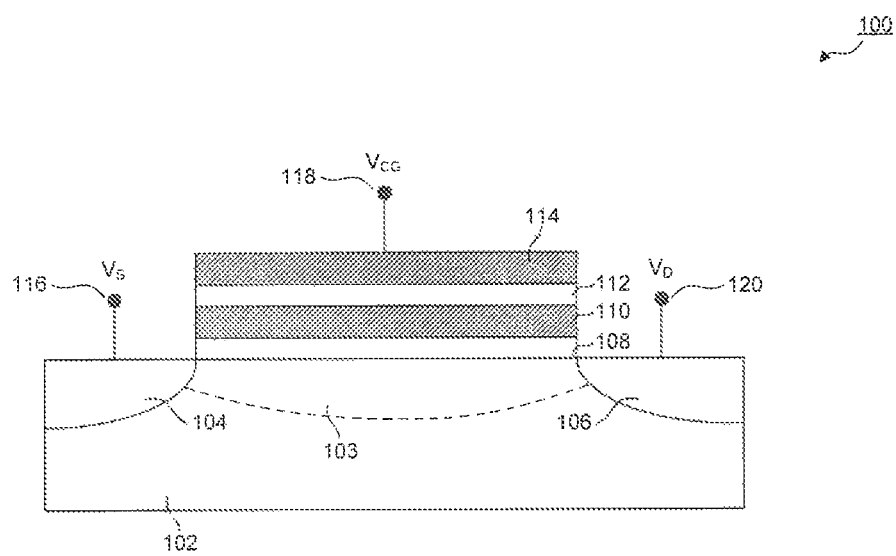
FIG. 1 illustrates a floating gate field effect transistor (FET) that can be used as a memory cell, according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally and/or structurally similar elements. The drawing in which an element first appears is indicated by the leftmost digit(s) in the corresponding reference number.

It is to be appreciated that any additional disclosure found in the figures is meant to be exemplary and not limiting to any of the features shown in the figures and described in the specification below.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

FIG. 1 shows a cross-sectional representation of an illustrative n-channel floating gate field effect transistor 100 used in a non-volatile memory array such as a flash memory. A substrate 102, typically, but not limited to, a silicon wafer, has formed therein a pair of source/drain (S/D) regions 104, 106. That portion of substrate 102 laterally disposed between source 104 and drain 106 is referred to herein as a channel region 103.

As can be seen in FIG. 1, source 104 and drain 106 are aligned to a stack that includes a gate dielectric layer 108, a floating gate 110, a dielectric layer 112, and a control gate 114. Floating gate 110 is electrically insulated from the channel region 103 by gate dielectric layer 108, and is electrically insulated from control gate 114 by dielectric layer 112. For illustrative purposes, in describing the operation of floating gate transistor 100, S/D terminal 104 is designated to be source terminal 104, and S/D terminal 106 is designated to be drain terminal 106.

The threshold voltage of floating gate transistor 100 can be modified by increasing or decreasing the amount of charge stored on floating gate 110. Electrons are typically placed on the floating gate by hot electron injection, and removed by tunneling. By convention, removing electrons is referred to as erasing, and adding electrons is referred to as programming. Those skilled in the art will recognize that FIG. 1 is illustrative only, and that other device structures that implement the functionality of the illustrated floating gate transistor are possible. By way of example, and not limitation, the control gate may wrap around the vertical sides of the floating gate, with both gates separated by a dielectric material. By way of further example, and not limitation, dielectric layer 112 and control gate 114 may comprise respectively a high-k dielectric material and a metal, metal alloy, or stack of metals and/or metal alloys.

Also shown in FIG. 1 are electrically conducting terminals 116, 118, and 120 in which voltages VS, VCG, and VD can be respectively applied to source region 104, control gate 114, and drain region 106.

Figure 2:
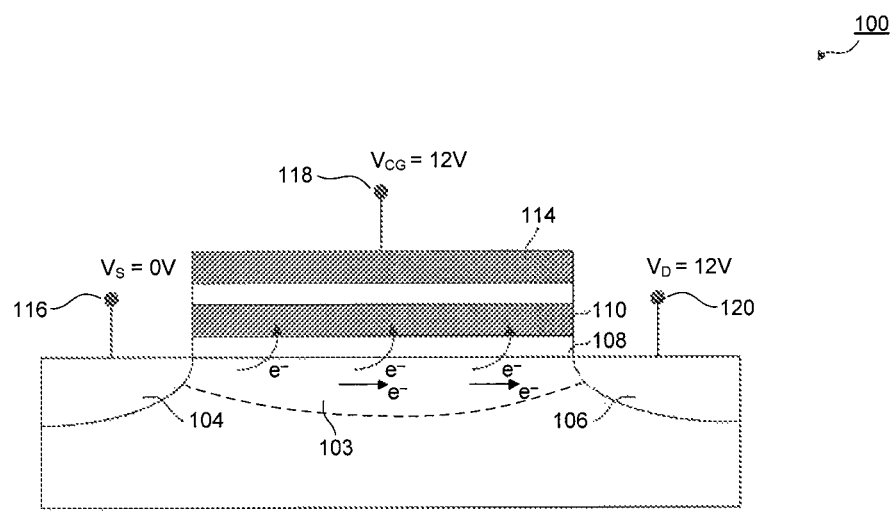
FIG. 2 illustrates a program operation in which electrons are placed on the floating gate by hot electron injection, according to an embodiment.

FIG. 2 shows the structure of FIG. 1 during a program operation in which electrons are injected onto the floating gate. To program floating gate transistor 100, a voltage source $V_S$ is applied to source terminal 116, voltage source $V_{CG}$ is applied to control gate 118, and voltage source $V_D$ is applied to drain 120 such that both the gate to source voltage and the drain to source voltages are predetermined positive values. In this example, the following values have been chosen: $V_S=0V$, $V_{CG}=12V$, and $V_D=12V$. Persons of ordinary skill in the art will recognize, however, that other voltages can also be chosen in order to carry out the program operation. Generally an elevated voltage (typically greater than 5V) is applied to control gate terminal 118 and drain terminal 120.

This arrangement causes electrons to be accelerated in channel region 103 between source 104 and drain 106 under the influence of the drain-to-source electric field. The accelerated electrons become sufficiently energetic that some of them have enough energy, after a collision with one or more atoms in the crystal lattice of channel region 103, to pass through floating gate dielectric layer 108 and become trapped in floating gate 110. The increased amount of negative charge on floating gate 110 makes the threshold voltage of floating gate transistor 100 higher, i.e., requiring a higher control gate-to-source voltage to turn on as discussed below.

Figure 3:
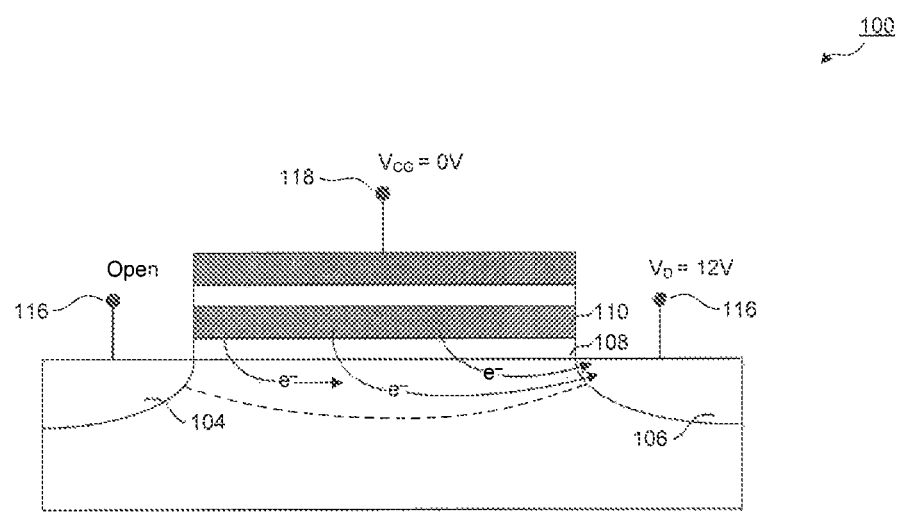
FIG. 3 illustrates an erase operation in which electrons are removed from the floating gate by electron tunneling, according to an embodiment.

FIG. 3 shows the structure of FIG. 1 during an erase operation in which electrons tunnel from floating gate 110 to drain 106. To erase floating gate transistor 100, source terminal 116 is floated, (i.e., isolated from any other voltage source so as to act as an open circuit), a voltage source VCG is applied to control gate terminal 118, and a voltage source VD is applied to drain terminal 116 such that a voltage difference of a predetermined magnitude is obtained. The applied voltages are such that the control gate is not attracting electrons and the drain is attracting electrons. In this example, the following values have been chosen: VS=open, VCG=0V, and VD=12V. Persons of ordinary skill in the art will recognize, however, that other voltages can also be chosen in order to carry out the erase operation. Generally an elevated voltage (typically greater than 5V) is applied to drain terminal 116.

This arrangement causes electrons stored on floating gate 110 to tunnel through floating gate dielectric 108, thereby reducing the amount of negative charge on floating gate 110, which in turn makes the threshold voltage of floating gate transistor 100 lower, i.e., able to turn on at a lower control gate-to source voltage as discussed below.

Figure 4:
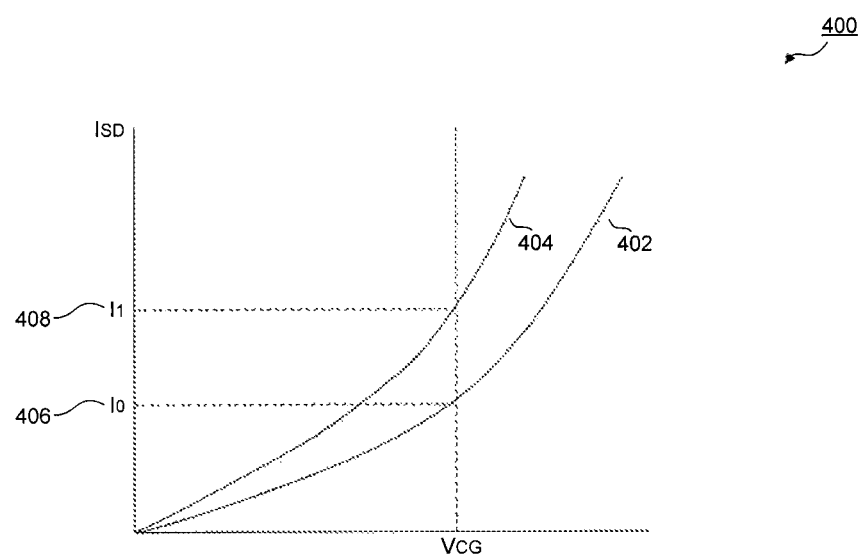
FIG. 4 illustrates a typical current-voltage characteristic of a floating gate FET with and without charge stored on the floating gate, according to an embodiment.

FIG. 4 illustrates an example current voltage characteristic 400 for a floating gate FET 100 as illustrated in FIGS. 1-3. The vertical axis represents the source-drain current $I_{SD}$ that flows between source 104 and drain 106 in the presence of a difference between the source voltage $V_S$ and drain voltage $V_D$ for a given voltage $V_{CG}$ applied to the control gate terminal 118. Curve 402 represents the current-voltage characteristic for floating gate FET 100 having a charge stored on the floating gate (i.e., floating gate FET has been programmed) and curve 404 represents the current-voltage characteristic for floating gate FET 100 wherein charge has been removed from the floating gate (i.e., floating gate FET has been erased).

By measuring the source-drain current $I_{SD}$, the charge state of the floating gate 110 can be determined. The two charge states can thus be used to represent the logical states 0 and 1. Two representative currents, 406 and 408, correspond to the logical 0 and logical 1 states, respectively. Physically, a charge stored on floating gate 110 screens the voltage $V_{CG}$ applied to the control gate and consequently less current $I_0$ flows between source and drain than the current $I_1$ that flows when floating gate 110 has been erased. Similarly the charge state of floating gate 110 can be determined by measuring the source-drain voltage difference ($V_S-V_D$) in an open circuit configuration.

In the examples discussed so far, there are two charge states representing logical 0 and logical 1 corresponding to the floating gate 110 being charged or uncharged, respectively. These examples were chosen for simplicity of illustration. More general logic states are also possible using devices that can contain multiple charge states, as is known to one of ordinary skill in the art.

Figure 5:
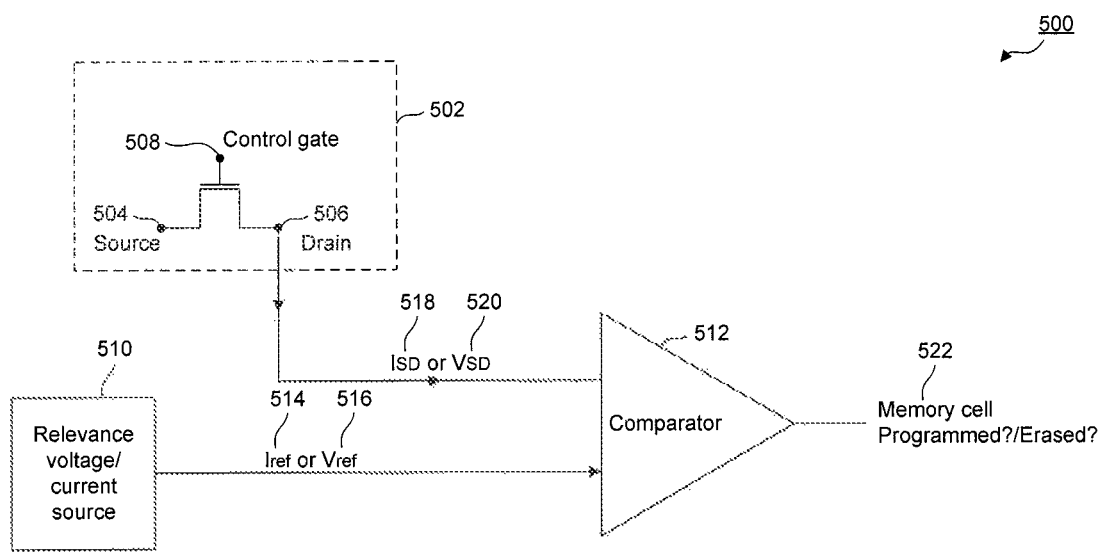
FIG. 5 illustrates a circuit for measuring the charge state of the floating gate FET by comparing the source-drain current or voltage to a reference current or voltage, according to an embodiment.

FIG. 5 illustrates an example circuit 500 for determining the charge state of a memory cell 502 comprising a floating gate FET having source, drain, and control gate contacts 504, 506, and 508, respectively. The circuit comprises the memory cell 502, a voltage/current reference 510, and a comparator 512. The reference source 510 provides a known current $I_{ref}$ 514 or known voltage $V_{ref}$ 516 to the comparator 512. The action of the comparator 512 is to compare the source-drain current $I_{SD}$ 518 or source-drain voltage $V_{SD}$ 520 with the corresponding reference voltage 514 or current 516. The reference is chosen to lie between the two values to be measured. If, for example, the current is to be measured, a reference current $I_{ref}$ is chosen as $I_0 < I_{ref} < I_1$, wherein, as in FIG. 4, the two currents $I_0$ and $I_1$ represent the two logic states 0 and 1 respectively and correspond to the floating gate being charged (programmed) or not (erased). The result 522 of the comparator determines if the current or voltage is greater or less than the reference.

The act of determining the state of a memory cell, as described above, is called a read operation. Generally the voltages and currents involved in reading a memory cell are considerably smaller in magnitude than are those used for programming and erasing memory cells to avoid adding or removing charge on the floating gate during the read operation. Even though the voltages are significantly lower during a read operation than during a program operation, it is still possible for some electrons to obtain sufficient energy to be injected through floating gate dielectric 108 and into floating gate 110 (see FIG. 1). This unintended charge injection increases the threshold voltage of floating gate transistor 100, and over some number of read operations this process can inject enough charge to change the state of the memory cell. This effect is sometimes referred to as a read disturb error.

Figure 6:
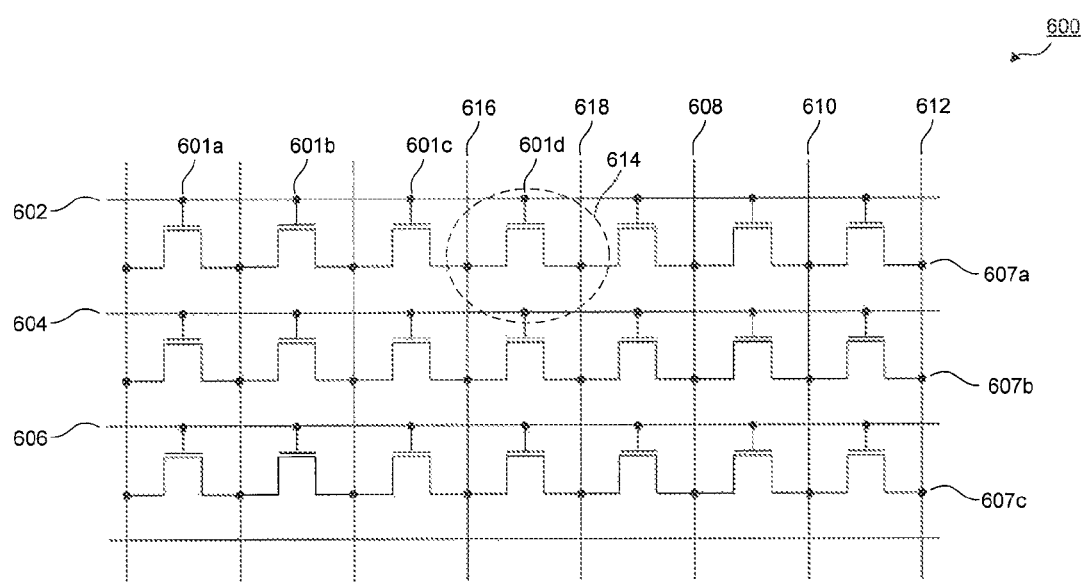
FIG. 6 illustrates an example memory array comprising floating gate transistors, according to an embodiment.

Flash memory devices typically include arrays of memory cells. An example of an array 600 of memory cells is illustrated in FIG. 6. In this example, the floating gate transistors in the array are interconnected such that their control gates (e.g., 601a, 601b, 601c, etc.) form a common node. That common node is referred to as a word-line. Examples of word lines are illustrated in FIG. 6 as the horizontal lines 602, 604, and 606.

Each word line is driven by a word-line driver circuit, which may apply a voltage to the control gates, that voltage having a magnitude dependent on whether these memory cells have been addressed, and on whether an erase, program, or read operation is to be performed. Flash memory arrays typically include many word-lines.

Similarly, in flash memory arrays it is common for a portion of the floating gate transistors in the array to be interconnected such that their drains (e.g., 607a, 607b, 607c, etc.) form a common node. This common node is referred to as a bit-line. Example bit lines are indicated in FIG. 6 as the vertical lines 608, 610, and 612.

A bit-line driver circuit may apply a voltage to the bit-line, that voltage having a magnitude dependent on whether a memory cell connected to the bit-line has been addressed, and on whether an erase, program, or read operation is to be performed. Flash memory arrays typically include many bit-lines.

Similarly to the read disturb error mentioned above, memory cells in an array also suffer from word line and bit line disturb errors. Word line and bit line disturb errors are similar to each other in that the voltages that appear across the terminals of a flash memory cell, i.e., across the terminals of a floating gate transistor, are such that electrons are caused to tunnel out of the floating gate, and typically into the drain. This data degradation phenomenon occurs in a memory cell that has not been selected, but which shares a word-line and/or bit-line with one or more memory cells that have been selected for an erase operation. Typically, such errors must be corrected using various refresh operations.

The state of a cell in memory array 600 can be read as follows. In order to read the state of cell 614, for example, a large positive voltage (e.g., 4.8V) is applied to word line 602 to supply a voltage to gate 601d of cell 614. A ground voltage (0V) can then be applied to bit line 616 and a drain voltage (e.g., 1.2V) can be applied to bit line 618. The state of cell 614 is then determined by comparing the current flowing in bit line 618 to a reference. Bit and word line disturb errors can be caused in cells other than 614 that are connected to word line 602 and bit lines 616 and 618.

A memory cell (e.g., 614 in array 600) is read by comparing its source-drain current or voltage to that of a reference, as was discussed with reference to FIG. 5. Reference voltage or current is sourced from a smaller reference array structure which can be built from memory cells or fixed voltage or current sources depending on the technology and design preferences. Each read type operation can be defined with different electric fields across the memory cell and can have its own reference source for fine tuning purposes.

Figure 7:
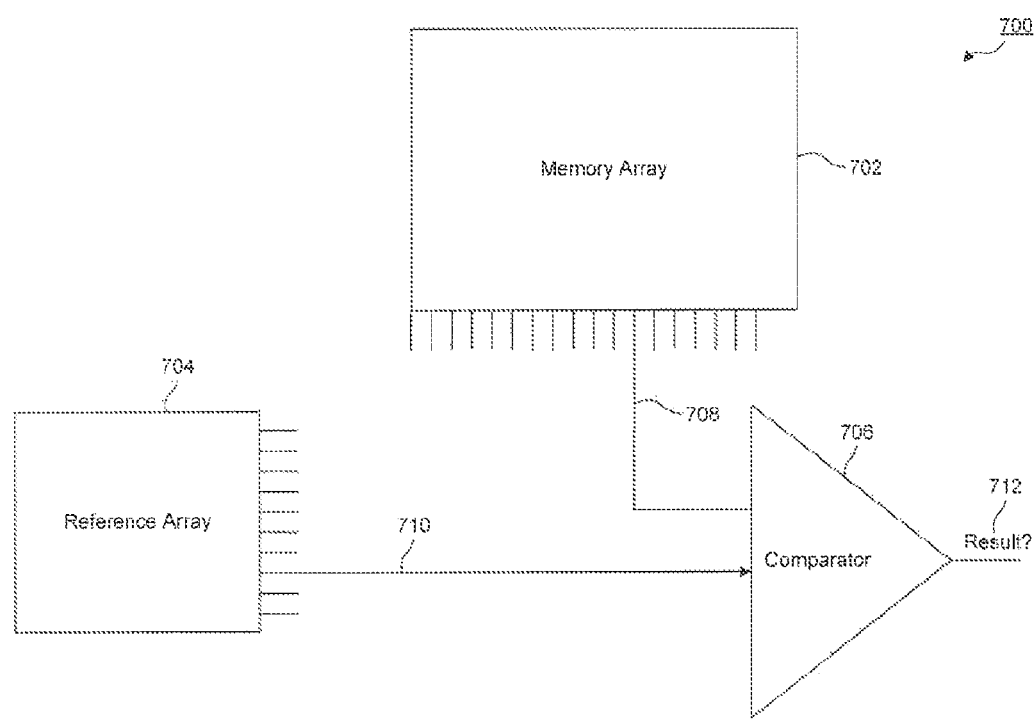
FIG. 7 illustrates an example reference array that provides a source reference current and/or voltage to a comparator for sensing the state of an element of memory array, according to an embodiment.

FIG. 7 represents an example system configuration 700 for determining the state of an element of a memory array, according to an embodiment. The system 700 includes a memory array 702, a reference array 704, and a comparator 706. One of the bit lines 708 from the memory array provides a current or voltage to the comparator 706. One of the outputs 710 of the reference array provides a reference current or voltage to the comparator 706. As discussed with reference to FIG. 5, the state of the selected memory cell (e.g., cell 614 in FIG. 6) can be determined by the result 712 of the comparator.

Figure 8:
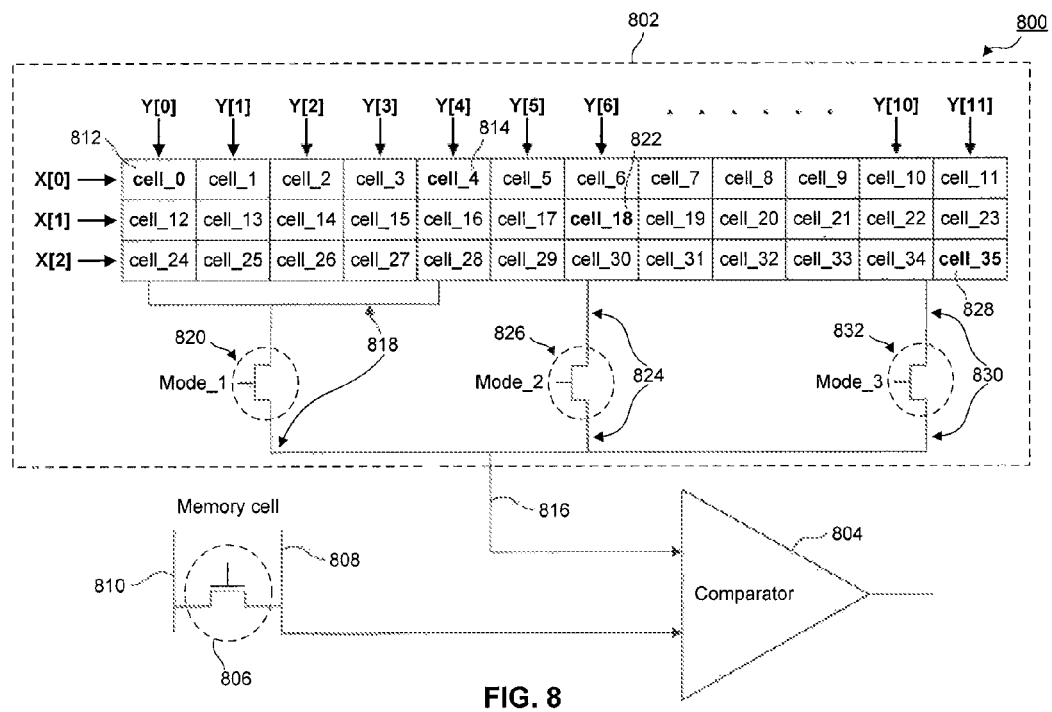
FIG. 8 illustrates an example conventional design of a reference array having fixed reference cells associated with particular modes of operation.

FIG. 8 illustrates an example of a conventional system 800 having a reference array 802, a comparator 804, and a memory cell 806 connected to bit lines 808 and 810. In this example, bit line 808 is connected to comparator 804 for determining the state of memory cell 806 in comparison to a reference current or voltage supplied by reference array 802. Reference sources in the reference array structure are used for different types of read operations and are traditionally assigned fixed locations in the design stage. Reference array 802 shows a structure made up of rows and columns of reference units from which some of the cells are used during read operations as voltage or current references. Since these references used for each read type operation are fixed during design stage, they each have pre-assigned X[i] and Y[j] decoding coordinates. Each time a particular operation is selected, the same reference cell(s) are chosen as described in the following examples.

Reference cell selection is illustrated for several modes of operation. In this example, for a first mode of operation (Mode_1), reference cells 812 (cell_0) and 814 (cell_4) are selected by applying control signals X [0], Y [0], and Y [4]. The output from cells 812 and 814 is combined to provide a current or voltage as an output signal 816 which is fed to comparator 804. In this example, a circuit 818 combines the output from reference cells 812 and 814 and is switched on by a control signal provided to a transistor 820.

In a farther example, a second mode of operation (Mode_2) is illustrated. In this example, a single reference cell 822 (cell_18) is used as the reference source. It is selected by applying control signals X [1], Y [6] to enable reference cell 822. A circuit 824 provides the output from cell 822 as output signal 816 to the comparator. In this example, circuit 824 includes a transistor 826 that is switched on by a control signal.

In a further example, a third mode of operation (Mode_3) is illustrated. In this example, a single reference cell 828 (cell_35) is used as the reference source. It is selected by applying control signals X [2], Y [11] to enable reference cell 828. A circuit 830 provides the output from cell 828 as output signal 816 to the comparator. In this example, circuit 830 includes a transistor 832 that is switched on by a control signal.

There are drawbacks associated with a conventional design such as system 800. As mentioned above, with a conventional design, the references used for a given operation (e.g., Mode_1, Mode_2, et.) are fixed during the design stage and thus have pre-assigned X[i], and Y[j] decoding coordinates. However, in general, not all reference cells perform as desired due to manufacturing related defects or a given pre-assigned cell's non-ideal behavior leading to yield loss and performance degradation.

Figure 9:
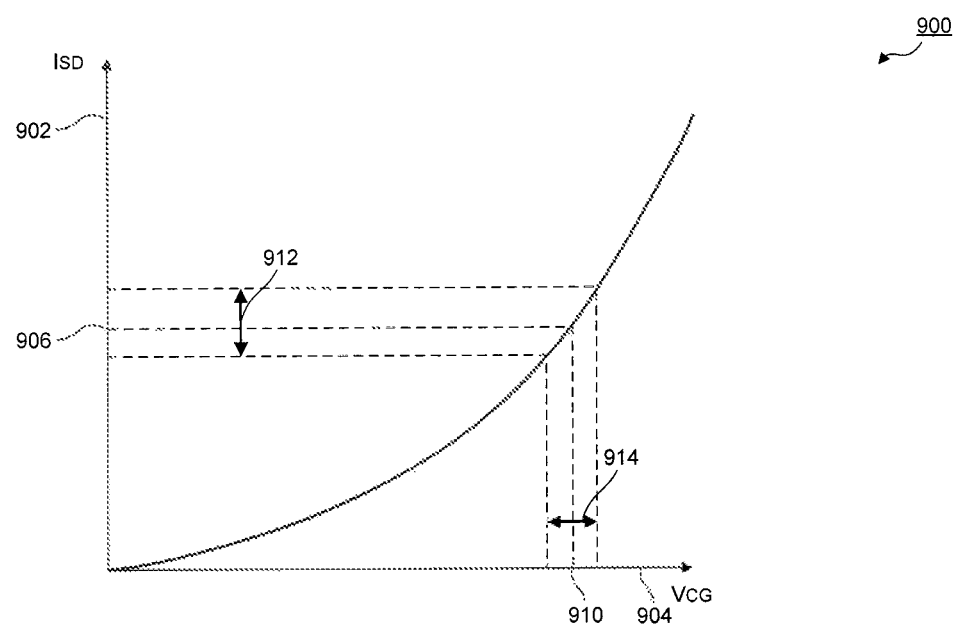
FIG. 9 illustrates a current-voltage relationship for a reference cell having a desired "ideal" response, according to an embodiment.

FIG. 9 illustrates a current-voltage relationship 900 for a reference cell having a desired "ideal" response, according to an embodiment. The vertical axis 902 plots the source-drain current $I_{SD}$ vs. the voltage $V_{CG}$ applied to the control gate represented by the horizontal axis 904. Also shown is a typical target current 906 resulting from a typical target voltage 910. Also shown is a typical target operating range 912 for the current resulting from a typical operating range 914 for the voltage.

Figure 10:
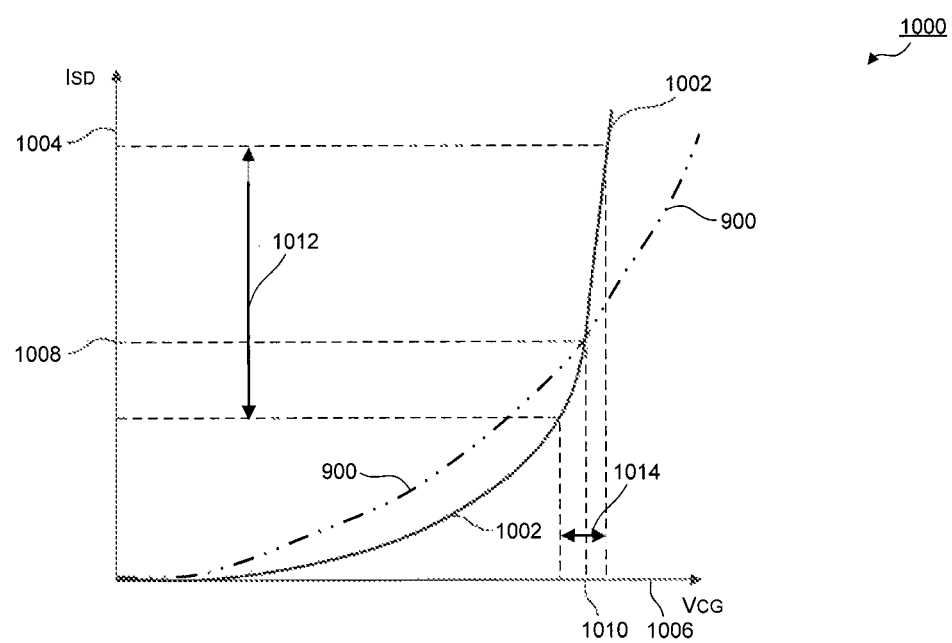
FIG. 10 illustrates a current-voltage relationship for a reference cell having a "non-ideal" response, according to an embodiment.

FIG. 10 presents a comparison 1000 between the current-voltage relationship 900 for an ideal reference cell (dot-dashed curve) along with the current-voltage relationship 1002 for a non-idea reference cell (solid curve). The vertical axis 1004 plots the source-drain current $I_{SD}$ vs. the voltage $V_{CG}$ applied to the control gate represented by the horizontal axis 1006. Although the typical target current 1008 resulting from a typical target voltage 1010 for the non-ideal cell is comparable for the two cells, the operating range 1012 for the non-ideal reference cell, for a given range 1014 of applied voltage, is larger for the non-ideal cell as that 912 for the ideal cell.

In order to overcome the problems associated with manufacturing defects and non-ideal cell behavior, embodiments are disclosed that provide for flexible (programmable) reference cell selection. A flexible reference cell selection concept is introduced to improve device performance and reduce manufacturing related yield loss. The disclosed embodiments implement a decoding scheme that is flexible enough to select (programmable selection) from any of the accessible locations in the reference structure after Silicon is received.

Figure 11:
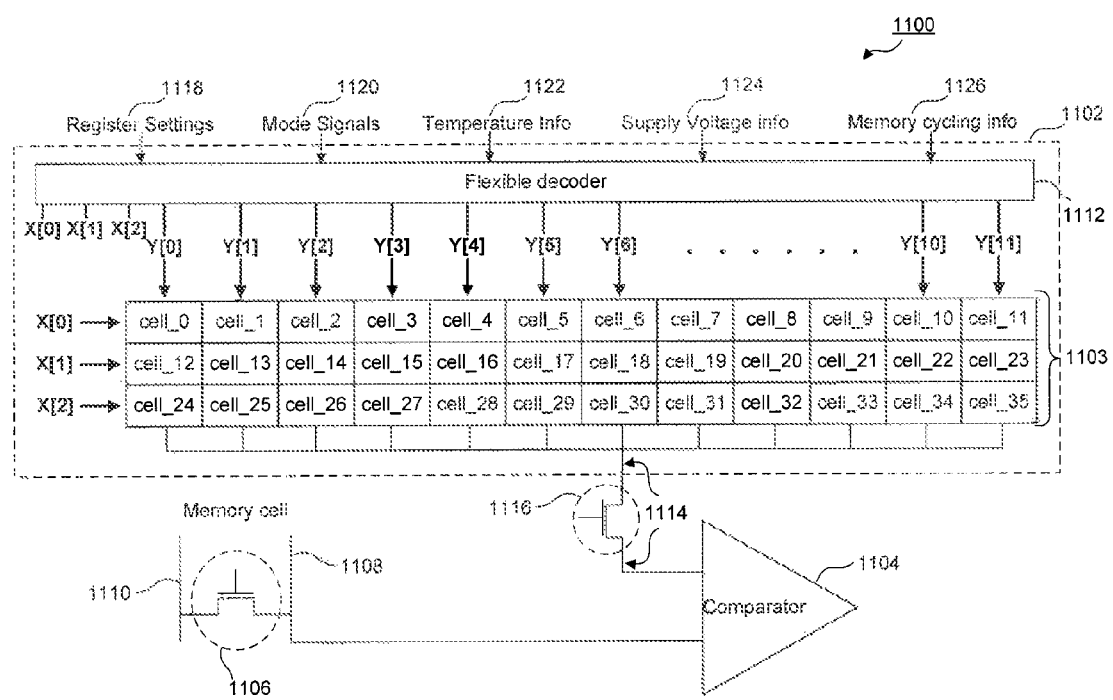
FIG. 11 illustrates a system in which flexible reference cell selection is implemented, according to an embodiment.

FIG. 11 illustrates a system 1100 in which flexible reference cell selection is implemented. This system includes a flexible reference array 1102, a comparator 1104, and at least one memory cell 1106 connected to bit lines 1108 and 1110. In this example, bit line 1108 is connected to comparator 1104 to provide output from the memory cell 1106 as input to the comparator 1104 in order to determine the state of memory cell 1106 in comparison to a reference current or voltage supplied by reference array 1102. A reference signal is supplied from the reference array 1102 via a circuit 1114 that can be switched on by a transistor 1116. Reference sources in the reference array structure are used for different types of read operations. Reference array 1102 shows a structure 1103 made up of rows and columns of reference units from which some of the cells are used during read operations as voltage or current references.

System 1100 includes a flexible decoder 1112 that provides control signals X[i] and Y[j] to the reference array 1103 to select one or more reference cells as required for various operations based on various inputs. In an embodiment, flexible decoder 1112 may be implemented with a state machine and/or a microprocessor. Possible inputs include any environmental condition that may change, for example, register settings 1118, mode signals 1120, temperature information 1122, supply voltage information 1124, memory cycling information 1126, etc.

While system 1100 is described with reference to reference cells providing voltage or current as output, the invention is not limited to that example embodiment. A person of skill in the relevant arts, based on the teachings provided herein, would appreciate that system 1100 may include an array of any type of selectable cell which provides outputs, including, but not limited to, sensor data, optical, or any other type of output signal.

Figure 12:
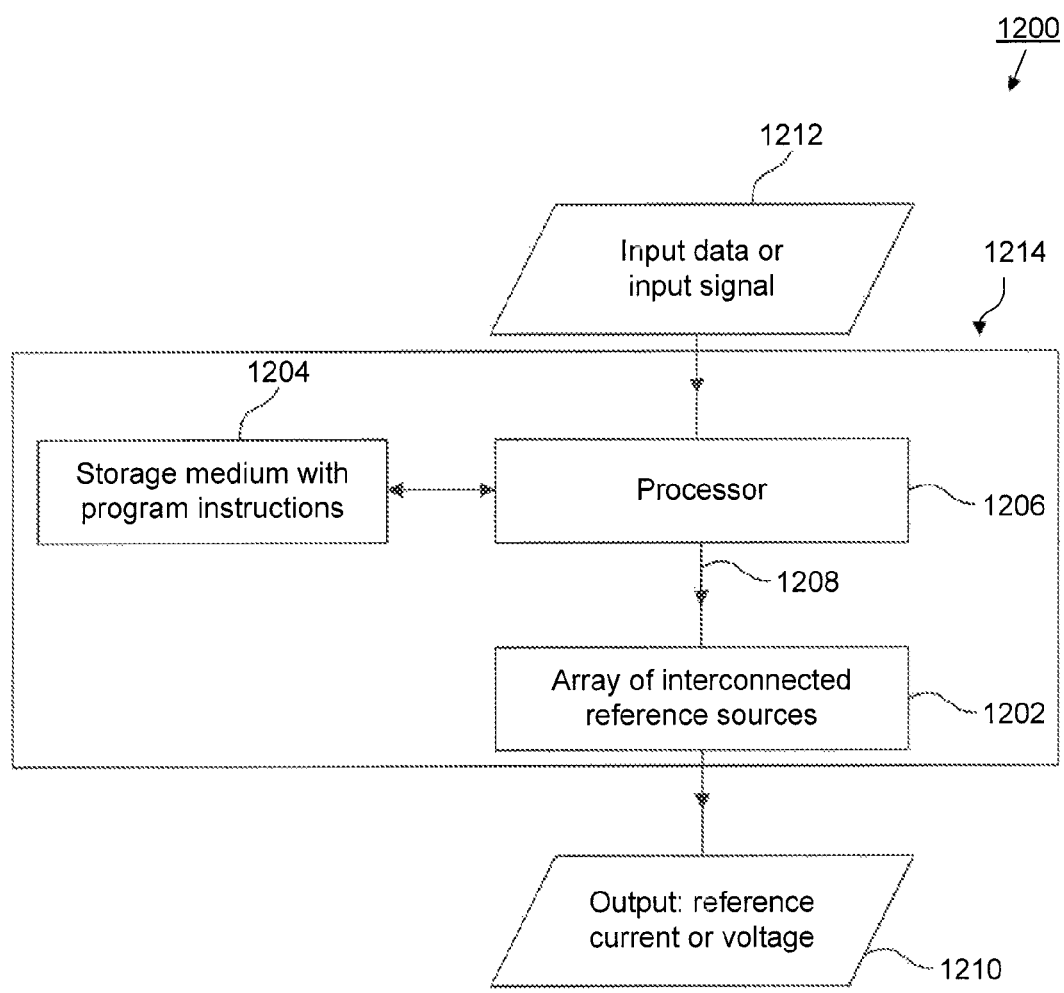
FIG. 12 illustrates a block diagram of a general system in which flexible reference cell selection is implemented, according to an embodiment.

FIG. 12 illustrates a block diagram of a general system 1200 in which flexible cell selection is implemented, according to various embodiments. System 1100 of FIG. 11 is a specific example of the more general system 1200.

System 1200 includes an array of interconnected reference sources 1202, a flexible decoder 1214. In an embodiment, flexible decoder 1214 includes a non-transitory storage medium 1204 having program instructions stored thereon, and a processor 1206. Array 1202 is configured with a plurality of cells that may be selected via an selections signal 1208 to array 1202. The form of selection signal 1208 may depend on the types of cells within array 1202. For example, array 1202 may be an array of reference sources configured to provide output in the form of current or voltage. In such a case, selection signal 1208 may also be a current or a voltage. However, according to an embodiment, array 1202 may be an array of sensors that provide output in the form of sensor data. In such a case, selection signal 1208 may be an electrical signal. In an embodiment, array 1202 may be an array of optical light sources that provide output in the form of light. In such a case selection signal 1208 may be an optical signal. Array 1202 is configured to receive a selection signal 1208 as input and to provide a corresponding output 1210. Processor 1206 is configured to execute program instructions, stored on storage medium 1204, so as to receive input data or an input signal 1212, generate a selection signal 1208 based on the input data or input signal 1212, and to provide selection signal 1208 to the array of interconnected reference sources 1202. In turn, the selection signal 1208 causes the array 1202 to select a cell and cause the selected cell to provide its respective output as output 1210. Non-transitory storage medium 1204 is reconfigurable and programmable so that the behavior of processor 1206 and array 1202 can be changed according to the desired behavior of system 1200.

Embodiments such as systems 1100 and 1200 represent a reliable solution to problems discussed above. Additional system complexity is minimal and existing design re-use is high. After silicon is received, by implementing different search algorithms, reference unit selection can be optimized for each read type operation based on the technology requirements and test time budget.

Systems 1100 and 1200, in FIGS. 11 and 12, respectively, are configured and arranged so as to be flexible/programmable with respect to reference cell selection. Several different algorithms can be implemented to scan the reference structure in order to select the best reference unit for each read type operation. Design can assign default locations for all needed reference cells for any active operation. However, once characterized, some cells may perform better than the others for a selected operation due to location dependencies in the reference structure. Programmable, hence flexible decoding methods, as disclosed herein, allow the best cells to be selected and dedicated for each read type operation. This concept provides a very powerful tool of reference fine tuning for each memory device. Hence, the standard deviation of the $V_t$ distributions would be tighter among large sample space and this directly affects device performance.

Figure 13:
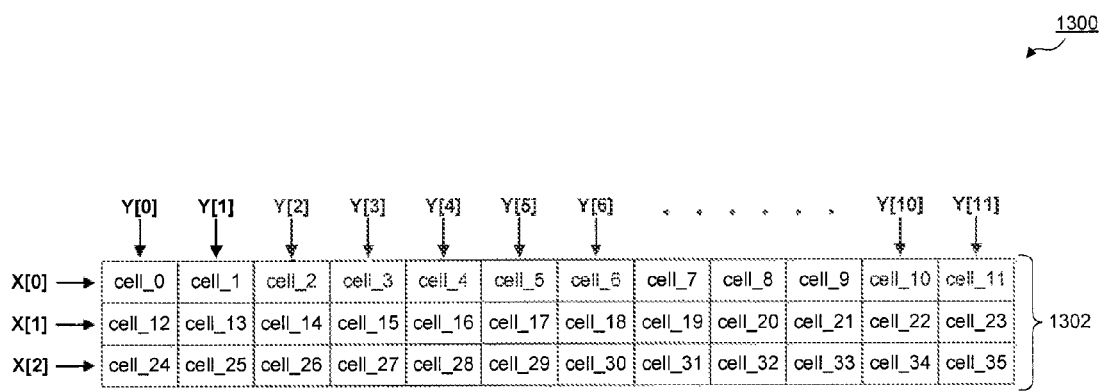
FIG. 13 illustrates the use of a flexible programming approach to reference cell selection, according to an embodiment.

Example 1300, shown in FIG. 13, illustrates the use of a flexible programming approach to reference cell selection using a system such as 1100 or 1200. Suppose a reference array 1302 is received from the manufacturer with certain default reference cells pre-defined for certain read operations. Various embodiments provide the ability to test various cells to determine if they are suitable for their intended purpose. For those cells that do not perform as expected, embodiments such as 1100 and 1200 provide ways to re-program the reference cell array so as to choose the best cells as needed for various operations.

Suppose, for example, that cell__0 (in reference array 1302 of FIG. 13) was set by the manufacturer as a reference cell for a "Mode 1" read operation. This cell would therefore have X[0],Y[0] decoding coordinates stored in the flexible decoder 1112 (see FIG. 11). However, after cell__0 is characterized it may be found to not behave as expected. It may, for example, have a non-ideal current-voltage relationship such as curve 1002 in FIG. 10, or it may behave as a short circuit or exhibit some other type of defect. In this case, it would be desirable to redefine the default reference cell for this operation. Suppose, for example, that after characterization, cell__13 is found to have desirable properties suitable for the "Mode 1" read operation. Using a system such as 1100 or 1200, it is possible to re-assign the "Mode 1" reference cell as cell__13 having decoding coordinates X[1],Y[1] by appropriately programming the flexible decoder 1112.

Suppose for this same example that the default reference cell for the "Mode 2" operation is cell__11 (of FIG. 13) having decoding coordinates X [0], Y [11] and further suppose that, after characterization, this cell does not behave as expected. Next, suppose cell__35 is found to have suitable characteristics for the intended "Mode 2" operation. Using a system such as 1100 or 1200, it is possible to re-assign the "Mode 2" reference cell as cell__35 having decoding coordinates X[2], Y[11] by appropriately programming the flexible decoder 1112 (of FIG. 11). The above examples illustrate the general principles of flexible reference cell selection using a system such as 1100 or 1200. Further examples will be readily apparent to a person of ordinary skill in the art.

Figure 14:
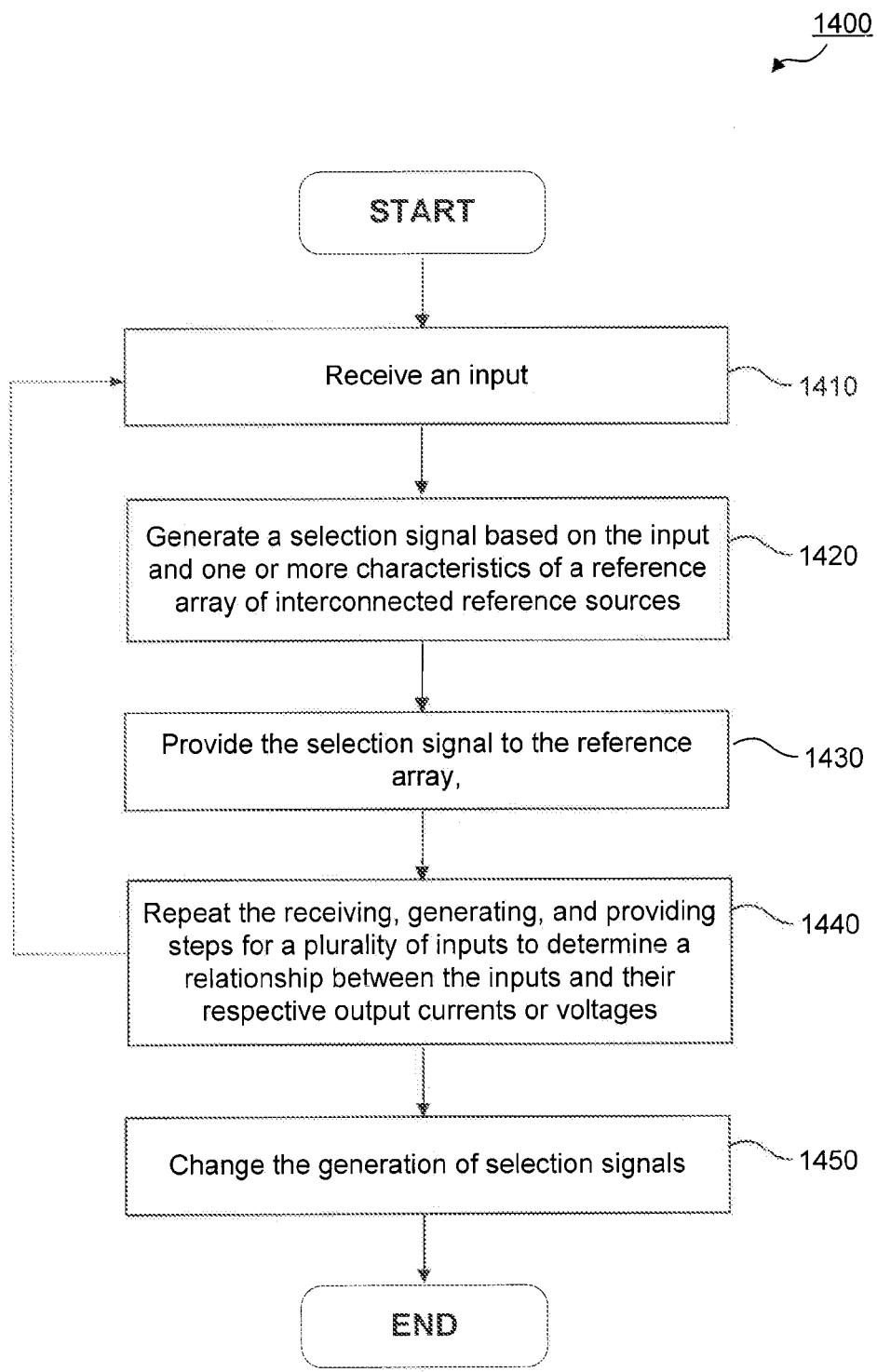
FIG. 14 is a flow chart illustrating a general method of programming a flexible reference array, according to an embodiment.

FIG. 14 is a flow chart illustrating a general method 1400 of programming a flexible reference array, according to an embodiment. The example given above with respect to FIG. 13 is a specific example of the general method illustrated in FIG. 14.

At block 1410 of method 1400, an input is received. For example, the input may be received by a flexible decoder, such as flexible decoder 1214 of FIG. 12. The input may be received in various forms depending on the particular implementation of method 1400, for example the input may be revived as a signal or data. The input may include any environmental condition that may change. For example, the input may include, but it is not limited to, register settings, mode signals, temperature information, supply voltage information, memory cycling information, or any other type of information that may aid in properly selecting a reference source.

At block 1420, a selection signal is generated based upon the input and one or more characteristics of a reference array of interconnected reference sources. In an embodiment, the selection signal may be generated by a flexible decoder, such as flexible decoder 1214 of FIG. 12. The selection signal may be used to select one or more cells of the reference array. The cells of the reference array (i.e the reference sources) may then be used to output particular reference voltages or currents. In an embodiment, the selection signal may be further generated by a processor, such as processor 1206 of FIG. 12, based upon instructions stored on a storage medium such as, storage medium 1204 of FIG. 12. In particular, the selection signal may be generated based upon determined characteristics of the array of interconnected reference sources. For example, some cells within the array of interconnected reference sources may perform better than others. In such a case, the selection signal may be generated to prefer cells with better performance to other cells with weaker performance. In other cases, some cells within the array may be damaged (for example due to defects) and the selection signal may be generated to avoid selection of these cells.

At block 1430, the selection signal is provided to the reference array. The signal may be provided to the reference array by a flexible decoder, such as flexible decoder 1214 of FIG. 12, according to an embodiment. Once the selection signal is provided to the reference array, such as reference array 1202 of FIG. 12, a reference source within the reference array may be selected. The reference source may then output a particular reference voltage or reference current from the reference array. In an embodiment, the reference output from the reference array may then be used to perform various operations on a memory array or cell, such as memory cell 1106 of FIG. 11. In particular, the reference output may be used to perform operations including, but not limited to, reading, programming/writing, and erasing.

At block 1440, the receiving 1410, the generating 1420, and the providing 1430 are repeated for a plurality of inputs to determine the relationship between the inputs and their respective output currents or voltages. For example, as discussed above, some cells within the reference array may be defective or perform better than other cells under some circumstances (e.g. location dependencies). In such cases, the output may be undesirable based upon the input and thus, the selected reference source may need to be adjusted for the particular input.

At block 1450, the generation of selection signals may be changed so as to change the relationship between the plurality of inputs and their respective output currents or voltages. If the output for a particular input is determined to be undesirable, the flexible decoder, such as flexible decoder 1214 may be configured to generate a different selection signal based on the input. In an embodiment, the flexible decoder may be implemented using a processor and a storage medium storing instructions, such as processor 1206 and storage medium 1204 of FIG. 12. In such a case, the instructions may be modified to cause the generation of a different selection signal in the cases where outputs need to be adjusted based upon their respective inputs.

Figure 15:
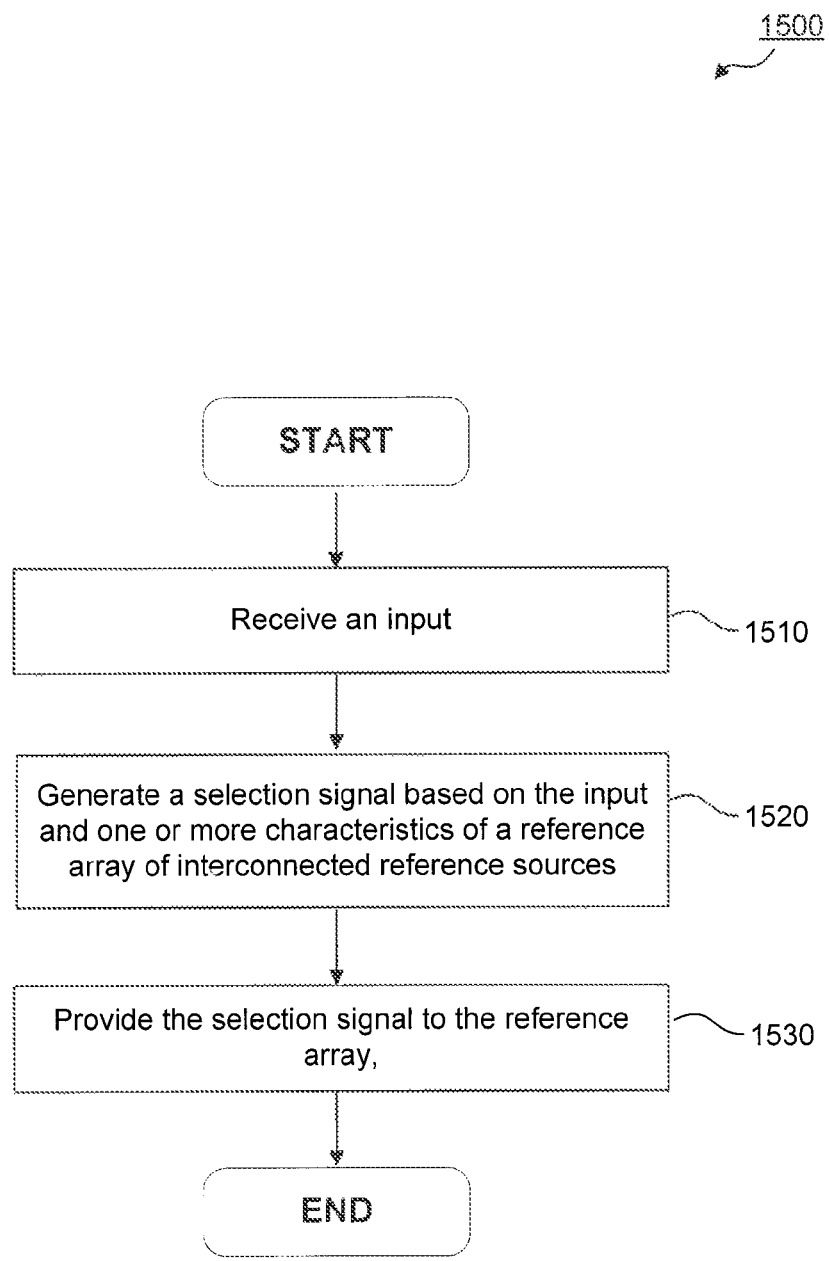
FIG. 15 is a flow chart illustrating a general method of using a flexible reference array to generate a reference current or voltage, according to an embodiment.

FIG. 15 is a flow chart illustrating a general method 1500 of using a flexible reference array, after it has been programmed, to generate a reference current or voltage, according to various embodiments.

At block 1510 of method 1500, an input is received. For example, the input may be received by a flexible decoder, such as flexible decoder 1214 of FIG. 12. The input may be received in various forms depending on the particular implementation of method 1500, for example the input may be revived as a signal or data. The input includes any environmental condition that may change. For example, the input may include, but it is not limited to, register settings, mode signals, temperature information, supply voltage information, memory cycling information, or any other type of information that may aid in properly selecting a reference source.

At block 1520, a selection signal is generated based upon the input and one or more characteristics of a reference array of interconnected reference sources. The selection signal may be generated by a flexible decoder, such as flexible decoder 1214 of FIG. 12, according to an embodiment. The selection signal may be used to select one or more cells of the reference array. The cells of the reference array (i.e the reference sources) may then be used to output particular reference voltages or currents. In an embodiment, the selection signal may be further generated by a processor, such as processor 1206 of FIG. 12, based upon instructions stored on a storage medium such as, storage medium 1204 of FIG. 12. In particular, the selection signal may be generated based upon determined characteristics of the array of interconnected reference sources. For example, some cells within the array of interconnected reference sources may perform better than others. In such a case, the selection signal may be generated to prefer cells with better performance to other cells with weaker performance. In other cases, some cells within the array may be damaged (for example due to defects) and the selection signal may be generated to avoid selection of these cells.

At block 1530, the selection signal is provided to the reference array. The signal may be provided to the reference array by a flexible decoder, such as flexible decoder 1214 of FIG. 12, according to an embodiment. Once the selection signal is provided to the reference array, such as reference array 1202 of FIG. 12, a reference source within the reference array may be selected. The reference source may then output a particular reference voltage or reference current from the reference array. In an embodiment, the reference output from the reference array may then be used to perform various operations on a memory array or cell, such as memory cell 1106 of FIG. 11. In particular, the reference output may be used to perform operations including, but not limited to, reading, programming/writing, and erasing.

While method 1500 is described with reference to reference cells providing voltage or current as output, the invention is not limited to that example embodiment. A person of skill in the relevant arts, based on the teachings provided herein, would appreciate that method 1500 may include an array of any type of selectable cell which provides outputs, including, but not limited to, sensor data, optical, or any other type of output signal.

Figure 16:
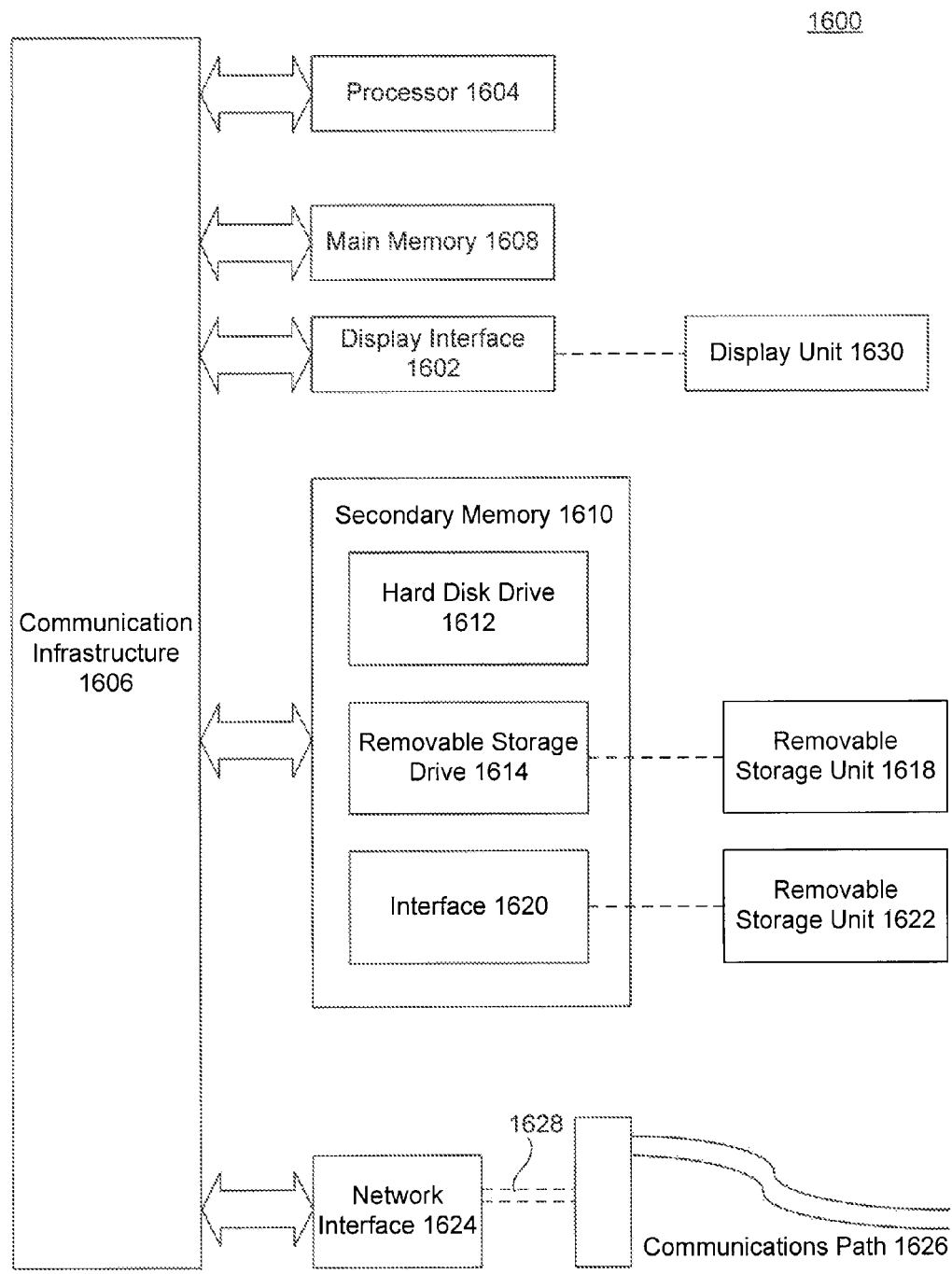
FIG. 16 is a block diagram of a processor based computing device in which embodiments of the invention may be implemented.

Various aspects of the present invention can be implemented by software, firmware, hardware, or a combination thereof. FIG. 16 illustrates an example computer system 1600 in which embodiments of the present invention, or portions thereof, can be implemented as computer-readable code. For example, the methods illustrated by flowcharts 1400 of FIGS. 14 and 1500 of FIG. 15, can be implemented in system 1600. Various embodiments of the invention are described in terms of this example computer system 1600. After reading this description, it will become apparent to a person skilled in the relevant art how to implement embodiments of the invention using other computer systems and/or computer architectures.

Computer system 1600 includes one or more processors, such as processor 1604. Processor 1604 can be a special purpose or a general purpose processor. Processor 1604 is connected to a communication infrastructure 1606 (for example, a bus or network).

Computer system 1600 also includes a main memory 1608, preferably random access memory (RAM), and may also include a secondary memory 1610. Secondary memory 1610 may include, for example, a hard disk drive 1612, a removable storage drive 1614, and/or a memory stick. Removable storage drive 1614 may comprise a floppy disk drive, a magnetic tape drive, an optical disk drive, a flash memory, or the like. The removable storage drive 1614 reads from and/or writes to a removable storage unit 1618 in a well-known manner. Removable storage unit 1618 may comprise a floppy disk, magnetic tape, optical disk, etc. that is read by and written to by removable storage drive 1614. As will be appreciated by persons skilled in the relevant art(s), removable storage unit 1618 includes a computer usable storage medium having stored therein computer software and/or data.

In alternative implementations, secondary memory 1610 may include other similar means for allowing computer programs or other instructions to be loaded into computer system 1600. Such means may include, for example, a removable storage unit 1622 and an interface 1620. Examples of such means may include a program cartridge and cartridge interface (such as that found in video game devices), a removable memory chip (such as an EPROM, or PROM) and associated socket, and other removable storage units 1622 and interfaces 1620 that allow software and data to be transferred from the removable storage unit 1622 to computer system 1600.

Computer system 1600 may also include a communications interface 1624. Communications interface 1624 allows software and data to be transferred between computer system 1600 and external devices. Communications interface 1624 may include a modem, a network interface (such as an Ethernet card), a communications port, a PCMCIA slot and card, or the like. Software and data transferred via communications interface 1624 are in the form of signals that may be electronic, electromagnetic, optical, or other signals capable of being received by communications interface 1624. These signals are provided to communications interface 1624 via a communications path 1626. Communications path 1626 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 1618, removable storage unit 1622, and a hard disk installed in hard disk drive 1612. Signals carried over communications path 1626 can also embody the logic described herein. Computer program medium and computer usable medium can also refer to memories, such as main memory 1608 and secondary memory 1610, which can be memory semiconductors (e.g. DRAMs, etc.). These computer program products are means for providing software to computer system 1600.

Computer programs (also called computer control logic) are stored in main memory 1608 and/or secondary memory 1610. Computer programs may also be received via communications interface 1624. Such computer programs, when executed, enable computer system 1600 to implement the present invention as discussed herein. In particular, the computer programs, when executed, enable processor 1604 to implement the processes of the present invention, such as the steps in the methods illustrated by flowcharts 200 of FIGS. 2 and 300 of FIG. 3, discussed above. Accordingly, such computer programs represent controllers of the computer system 1600. Where the invention is implemented using software, the software may be stored in a computer program product and loaded into computer system 1600 using removable storage drive 1614, interface 1620, hard drive 1612 or communications interface 1624.

Embodiments of the invention are also directed to computer program products comprising software stored on any computer useable medium. Such software, when executed in one or more data processing device, causes a data processing device(s) to operate as described herein. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.).

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A system, comprising:
   an array of interconnected cells configured to:
      receive a selection signal as input;
      select a cell based upon the selection signal; and
      provide an output based upon the selected cell; and
   a flexible decoder comprising:
      a memory storing programming instructions, wherein the programming instructions correlate any input to any selection signal; and
      wherein the flexible decoder is configured to:
      receive an input;
      determine the selection signal based on the input and one or more characteristics of the array of interconnected cells by executing the programming instructions; and
      provide the selection signal to the array of interconnected cells.

2. The system of claim 1, wherein the array of interconnected cells includes a reference array of reference sources; and
   wherein the output is a reference current or voltage.

3. The system of claim 1, wherein the array of interconnected cells includes an array of sensor cells; and
   wherein the output is output from a sensor cell.

4. The system of claim 1, wherein the program instructions and processor are configured to receive input in the form of a detectable environmental condition.

5. The system of claim 2, further comprising:
   a memory array of interconnected memory cells; and
   at least one comparator configured to:
   receive a signal from the reference array and a signal from the memory array; and
   determine the state of at least one memory cell by comparing the signals from the reference array and the memory array.

6. The system of claim 5, wherein the flexible decoder is further configured to:
   provide signals to the memory array and the reference array so as to perform at least one of the following operations on the memory array: read, program/write, and erase.

7. The system of claim 5, wherein the flexible decoder is further configured to:
   receive input in the form of a detectable environmental condition; and
   perform at least one of the following operations on the memory array based on the received input: read, program/write, and erase.

8. The system of claim 5, wherein the flexible decoder is further configured to:
perform periodic monitoring of the memory array to detect errors; and
perform refresh operations to correct errors.

9. A method of conditioning a reference array, comprising:
receiving an input;
generating a selection signal, based on the input and one or more characteristics of a reference array of interconnected reference sources;
correlating the generated selection signal with the input in one or more programming instructions, wherein the programming instructions correlate any input to any selection signal;
providing the selection signal to the reference array, wherein the reference array provides a reference current or voltage as output corresponding to the selection signal;
repeating the receiving, generating, and providing steps for a plurality of inputs to determine a relationship between the inputs and their respective output currents or voltages; and
changing the generation of selection signals so as to change the relationship between the plurality of inputs and their respective output currents or voltages.

10. The method of claim 7, further comprising:
receiving input in the form of a detectable environmental condition.

11. A method, comprising:
receiving an input;
generating a selection signal by executing programming instructions based on the input and one or more characteristics of a reference array of interconnected reference sources, wherein the programming instructions correlate any input to any selection signal; and
providing the selection signal to the reference array, wherein the reference array provides a reference current or voltage as output corresponding to the selection signal.

12. The method of claim 11, further comprising:
receiving input in the form of a detectable environmental condition.

13. The method of claim 11, further comprising:
generating and providing an input signal to a memory array of interconnected memory cells;
receiving an output signal from the memory array; and
determining the state of at least one memory cell by comparing the output signal from the reference array with the reference current or voltage from the reference array.

14. The method of claim 13, further comprising:
providing signals to the memory array and reference array so as to perform at least one of the following operations on the memory array: read, program/write, and erase.

15. The method of claim 13, further comprising:
receiving input in the form of a detectable environmental condition; and
performing one of the following operations on the memory array based on the received input: read, program/write, and erase.

16. The method of claim 13, further comprising:
performing periodic monitoring of the memory array to detect errors; and
performing refresh operations to correct errors.

17. A non-transitory computer readable storage medium having program instructions stored thereon that, when executed by a processor, cause the processor to perform operations, the operations comprising:
receiving an input;
generating a selection signal by executing programming instructions based on the input and one or more characteristics of a reference array of interconnected reference sources, wherein the programming instructions correlate any input to any selection signal; and
providing the selection signal to a reference array of interconnected reference sources to cause the array to provide a reference current or voltage as output.

18. The computer readable storage medium of claim 17, wherein the operations further comprise:
receiving input in the form of a detectable environmental condition.

19. The computer readable storage medium of claim 17, wherein the operations further comprise:
generating and providing an input signal to a memory array of interconnected memory cells; receiving an output signal from the memory array; and
determining the state of at least one memory cell by comparing the output signal from the reference array with the reference current or voltage from the reference array.

20. The computer readable storage medium of claim 17, wherein the operations further comprise:
providing signals to the memory array and reference array so as to perform at least one of the following operations on the memory array: read, program/write, and erase.

21. The computer readable storage medium of claim 19, wherein the operations further comprise:
receiving input in the form of a detectable environmental condition; and
performing at least one of the following operations on the memory array based on the received input: read, program/write, and erase.

22. The computer readable storage medium of claim 19, wherein the operations further comprise:
performing periodic monitoring of the memory array to detect errors; and
performing refresh operations to correct errors.

* * * * *